(12) United States Patent
Ma

(10) Patent No.: US 7,189,093 B2
(45) Date of Patent: Mar. 13, 2007

(54) SOCKET CONNECTOR FOR CARRYING INTEGRATED CIRCUIT PACKAGE

(75) Inventor: Hao-Yun Ma, Tu-Chen (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/994,788

(22) Filed: Nov. 22, 2004

(65) Prior Publication Data

US 2005/0118856 A1    Jun. 2, 2005

(30) Foreign Application Priority Data

Nov. 27, 2003    (TW) .............................. 92220960 U

(51) Int. Cl.
*H01R 13/62* (2006.01)
(52) U.S. Cl. ..................... 439/331; 439/71; 439/525
(58) Field of Classification Search ............ 439/70–71, 439/330–331, 525
See application file for complete search history.

(56) References Cited

U.S. PATENT DOCUMENTS

| 4,502,747 | A | * | 3/1985 | Bright et al. ............... 439/296 |
| 5,302,853 | A | * | 4/1994 | Volz et al. .................. 257/707 |
| 6,648,664 | B1 | * | 11/2003 | McHugh et al. ............ 439/331 |

* cited by examiner

*Primary Examiner*—Truc Nguyen
(74) *Attorney, Agent, or Firm*—Wei Te Chung

(57) ABSTRACT

A socket connector includes a plurality of conductive terminals received in an insulative housing, a stiffener surrounding the housing, a load plate pivotably assembled with one end of the stiffener and a load lever pivotably attached to the other end of the stiffener. The housing has a bottom wall facing the PCB. The bottom wall defines a plurality of semi-cylindrical protrusions. The stiffener body defines a plurality of semi-circular slits corresponding to the semi-cylindrical protrusions. By virtue of the mesh of the semi-cylindrical protrusions and the semi-circular slits, the stiffener body is assembled with the housing completely.

7 Claims, 4 Drawing Sheets

SOCKET CONNECTOR FOR CARRYING INTEGRATED CIRCUIT PACKAGE

BACKGROUND OF THE INVENTION

1. Field of the Invention

The present invention relates to a socket connector for electrically connecting an integrated circuit to a printed circuit board, especially to a land grid array socket connector having a housing attached with a stiffener body.

2. Description of the Prior Art

Various types of conventional integrated circuit (IC) sockets for attaching IC packages are known. Each of the IC packages has a large number of contacts that are arranged in a matrix-like array. The IC packages are classified as pin grid array (PGA) packages, ball grid array (BGA) packages, or land grid array (LGA) packages, depending on the shape of an electric contact portion of the contacts. The contacts in each of the IC packages are brought into contact with corresponding contacts arranged in a housing of the socket connector to establish electrical connection therebetween.

To an LGA socket connector, additional components are attached with the housing for positioning the LGA IC package. The mating of the additional components typically causes a large pressure to be exerted on the housing. In order to release or transfer the pressure, the housing is generally provided with a stiffener body, and said components are attached to the stiffener body.

FIG. 5 discloses a conventional LGA socket connector 8 for electrically connecting an LGA IC package (not shown) to a printed circuit board (PCB, not shown). The conventional socket connector 8 comprises a plurality of conductive terminals (not shown) received in an insulative housing 82, a stiffener body 83 surrounding the housing 82, a load plate 84 pivotably assembled with one end of the stiffener body 83 and a load lever 85 pivotably attached to the other end of the stiffener body 83.

The housing 82 has a bottom wall 822 facing the PCB. The bottom wall 822 defines a plurality of cubical protrusions 824. The stiffener body 83 defines a plurality of slits 830 corresponding to the protrusions 824. By virtue of the mesh of the protrusions 824 and the slits 830, the stiffener body 83 is assembled with the housing 82. For ensuring the engagement of the housing 82 and the stiffener body 83, the protrusions 824 are heated and expand in the slits 830. Finally, the housing 82 is firmly and reliably retained in the stiffener body 83 by the cooperation of the cubical protrusions 824 and the corresponding slits 830.

However, during the heating process to the protrusions, the expansion degree of each of the protrusions is not well-proportioned because of the outer cubical figuration. The protrusion can not fill the slit completely. Accordingly, the mesh of the protrusion and the slit is not compact, and the engagement of the housing and the stiffener body is not reliable or firm. As a result, the housing is not limited but movable in the stiffener body, which seriously affects the connection between the IC package and the socket connector.

Hence, a new socket connector which overcomes the above-described disadvantages is desired.

SUMMARY OF THE INVENTION

Accordingly, a primary object of the present invention is to provide a socket connector having a housing and a stiffener body attached to each other compactly.

In order to achieve the above-mentioned object, a socket connector in accordance with a preferred embodiment of the present invention is used to electrically connect an integrated circuit (IC) package to a printed circuit board (PCB). The socket connector comprises a plurality of conductive terminals received in an insulative housing, a stiffener surrounding the housing, a load plate pivotably assembled with one end of the stiffener and a load lever pivotably attached to the other end of the stiffener. The housing has a bottom wall facing the PCB. The bottom wall defines a plurality of semi-cylindrical protrusions. The stiffener body defines a plurality of semi-circular slits corresponding to the semi-cylindrical protrusions. By virtue of the mesh of the semi-cylindrical protrusions and the semi-circular slits, the stiffener body is assembled with the housing. For ensuring the engagement of the housing and the stiffener body, the semi-cylindrical protrusions are heated and expand in the semi-circular slits. Finally, the housing is firmly and reliably retained in the stiffener body by the compact cooperation of the semi-cylindrical protrusions and the corresponding semi-circular slits. Because the protrusion is semi-cylindrically configured, the expansion degree is proportioned, and can fill the semi-circular slit completely. By virtue of the compact engagement of the semi-cylindrical protrusions and the semi-circular slits, the housing is firmly and reliably accommodated in the stiffener body.

Other objects, advantages and novel features of the present invention will become more apparent from the following detailed description when taken in conjunction with the accompanying drawings, in which:

DESCRIPTION OF THE PREFERRED EMBODIMENT

Reference will now be made to the drawings to describe the present invention in detail.

Figure 1:
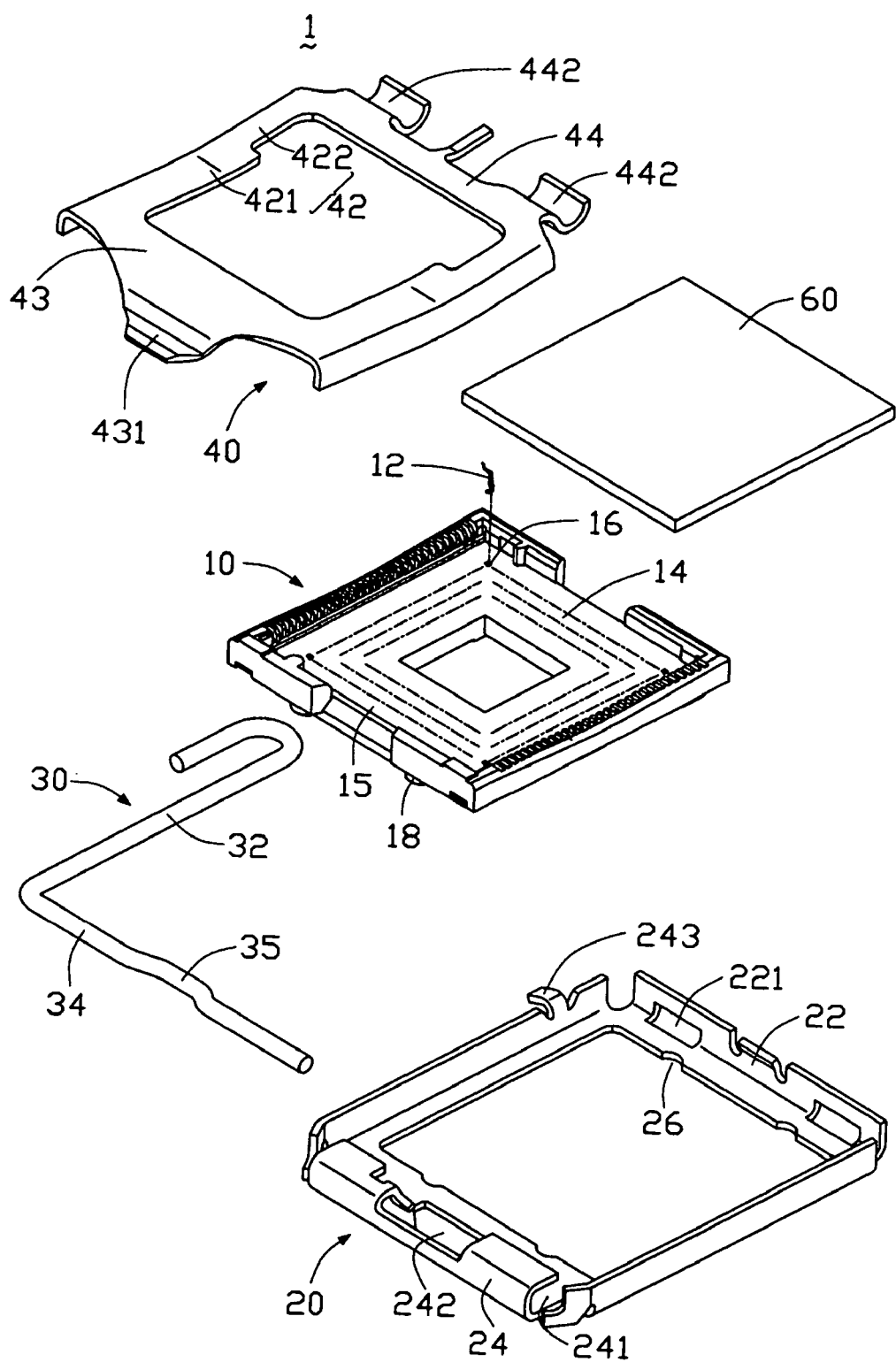
FIG. 1 is an exploded, isometric view of a socket connector in accordance with a preferred embodiment of the present invention, shown with an integrated circuit package ready to be mounted onto the connector.
Figure 2:
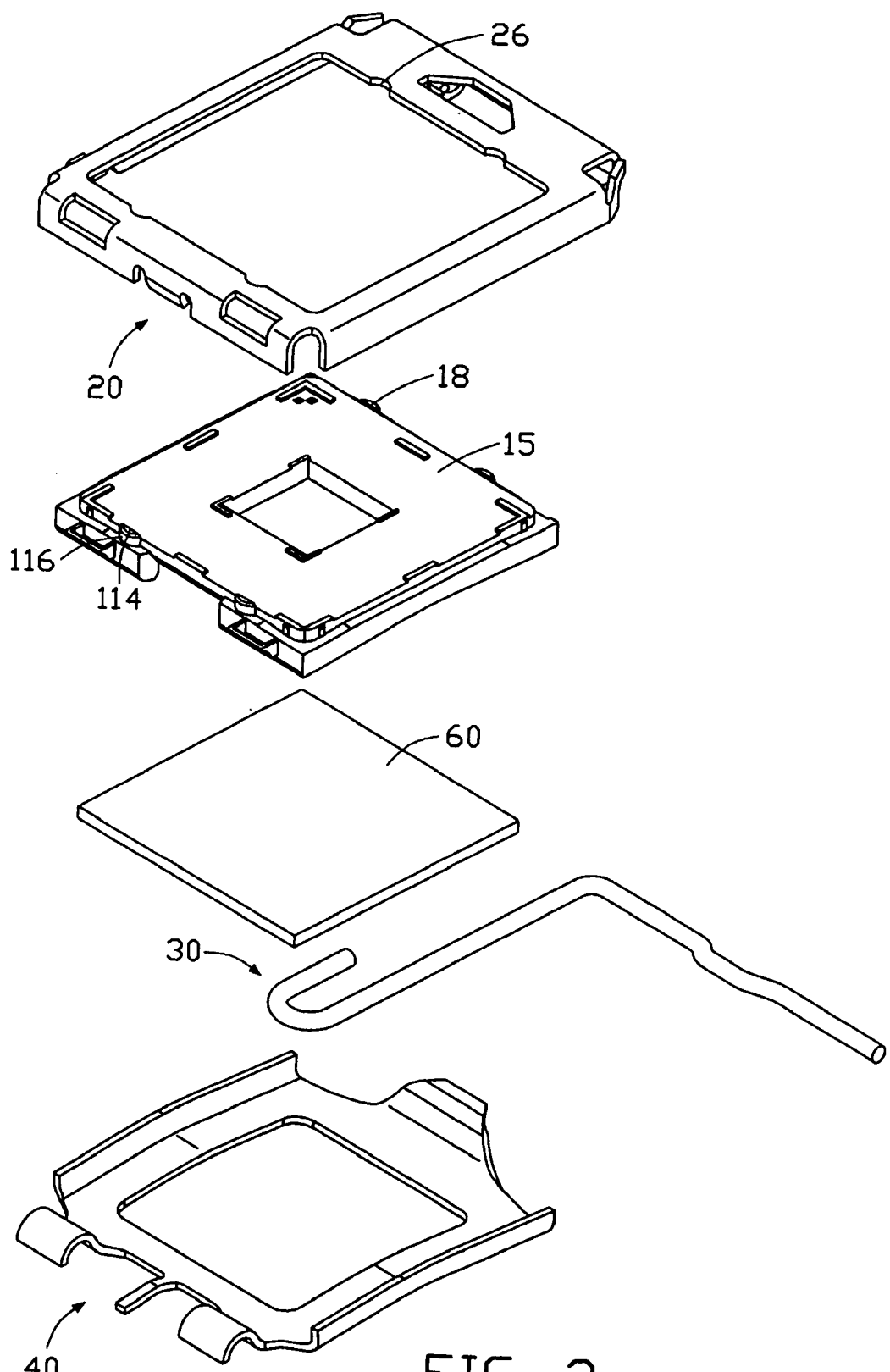
FIG. 2 is similar to FIG. 1, but shown all the components inverted.
Figure 3:
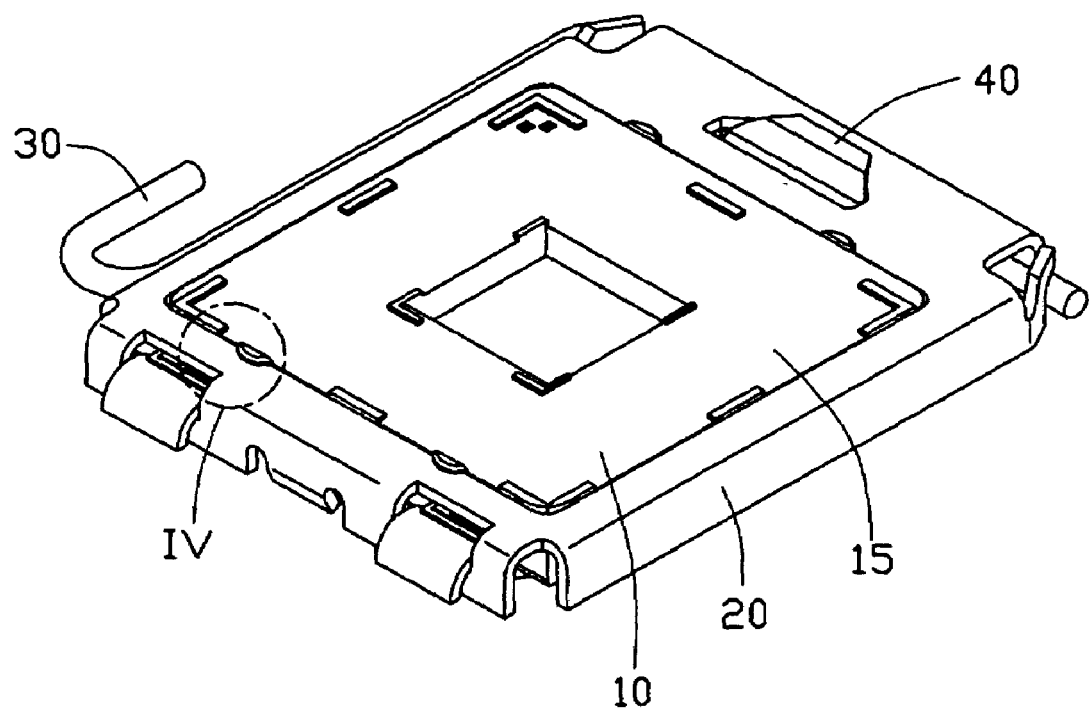
FIG. 3 is an isometric view of FIG. 2.
Figure 4:
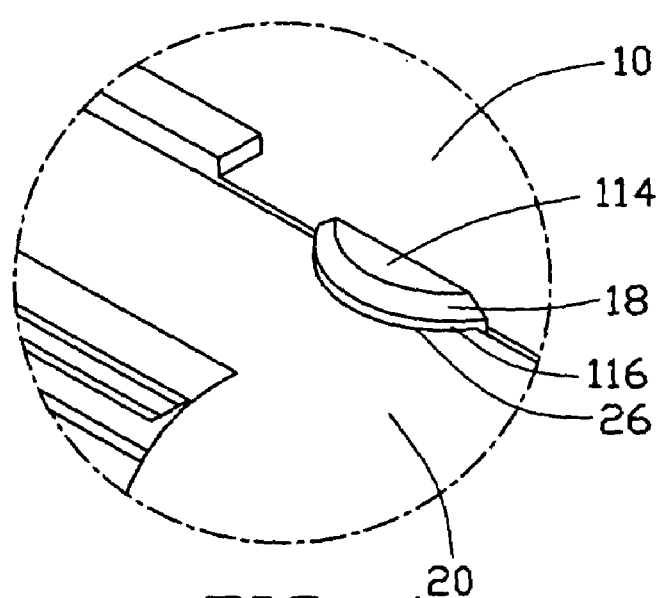
FIG. 4 is an enlarged view of a circled portion IV of FIG. 3.
Figure 5:
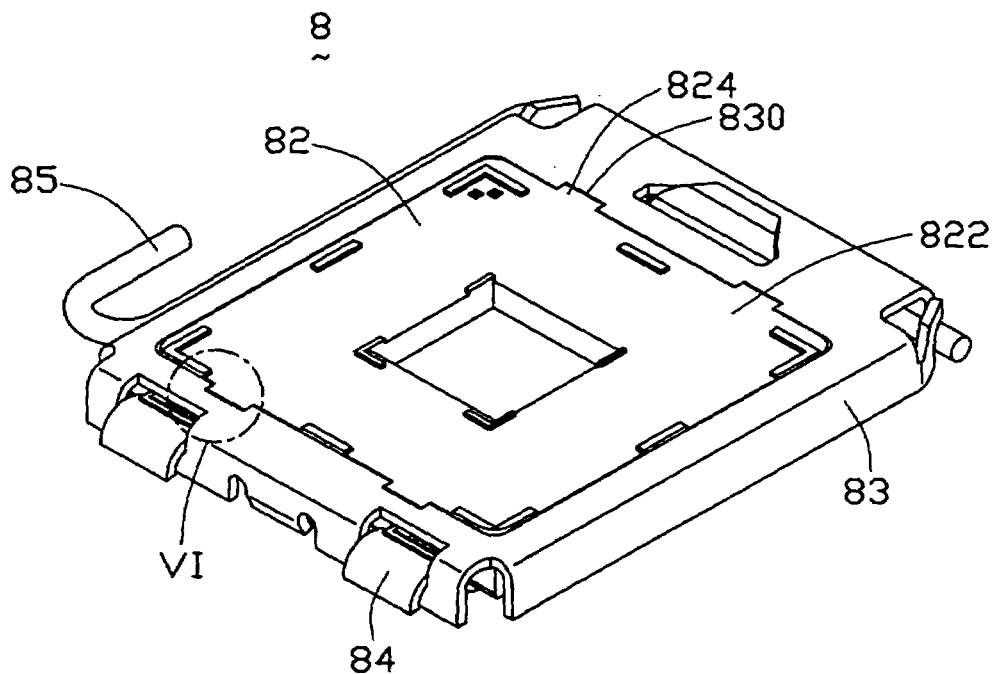
FIG. 5 is an inverted isometric view of a conventional socket connector.
Figure 6:
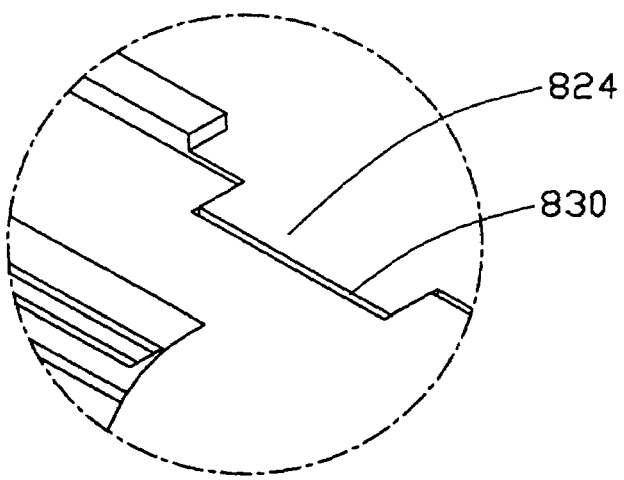
FIG. 6 is an enlarged view of a circled portion VI of FIG. 5.

Referring to FIGS. 1–2, a socket connector 1 in accordance with a preferred embodiment of the present invention is used for electrically connecting an integrated circuit (IC) package 60 to a printed circuit board (PCB) (not shown). The socket connector 1 comprises an insulative housing 10 accommodating a plurality of arrayed terminals 12 therein, a stiffener body 20 surrounding the housing 10, a load plate 40 assembled with the stiffener body 20, and a load lever 30 opposite to the load plate 40.

The housing 10 defines a recessed area 14 for receiving the IC package 60 therein. The housing 10 defines a bottom wall 15 and the bottom wall 15 defines a plurality of passageways 16 for accommodating the terminals 12 therein. The bottom wall 15 further defines a plurality of semi-cylindrical protrusions 18 at a peripheral portion thereof. Each of the semi-cylindrical protrusions 18 has a bottom surface 114 substantially parallel to the bottom wall 15 and a side surface 116 substantially perpendicular to the bottom surface 114. After the socket connector 1 is mounted on the PCB, a distance from the bottom surface 114 is shorter than a distance from the bottom wall 15 to the PCB.

The stiffener body 20 includes a first end 22 defining a pair of spaced pivotal opening 221, and a second end 24 opposite to the first end 22 and defining a pivotal slot 241 and a receiving slot 242. The stiffener 20 further defines a restricting block 243 at a sidewall thereof. Corresponding to the semi-cylindrical protrusions 18, the stiffener 20 defines a plurality of semi-circled slits 26.

The load plate 40 includes a pair of pressing portions 42, a first connecting beam 43 linking the two pressing portions 42 at one end, and a second connecting beam 44 linking the two pressing portions 42 at the other end. Each pressing portion 42 defines a wider part 421 and a narrower part 422 connecting with the wider part 421. The first connecting beam 43 defines a holding portion 431 protruding therefrom, and the second connecting beam 44 defines a pair of spaced pivotal segments 442.

The load lever 30 comprises a pivotal section 34 defining a suppressing section 35 rising from the pivotal section 34, and an actuating section 32 substantially perpendicular to the pivotal section 34.

Referring to FIGS. 1–4, after the above described components are assembled together, the load plate 40 is assembled to the first end 22 of the stiffener 20 with the pivotal segments 442 cooperating with the pivotal openings 221, and the load lever 30 is assembled to the second end 24 of the stiffener 20 with the pivotal section 34 being received in the pivotal slot 241. Therefore, the load plate 40 and the load lever 30 can rotate relative to the stiffener 20, and the suppressing section 35 can move in the receiving slot 242. The semi-cylindrical protrusions 18 are received in the semi-circled slits 26, respectively. After the assembly said above is finished, the semi-cylindrical protrusions 18 are heated for expanding in the semi-circled slits 26 to fill the slits 26 completely.

When the socket connector 1 is closed, the pressing portions 42 press on the IC package 60. The suppressing section 35 of the load lever 30 acts on the holding portion 431 of the load plate 40, and finally the actuating section 32 being restricted by the restricting block 243. Thus, the IC package 60 is positioned and restricted in place reliably and firmly.

As the protrusions 18 are semi-cylindrically configured, the expand degree thereof is proportioned. Therefore, the protrusions 18 can fill the slits 26 completely. It is noted that the protrusions 18 can fill the slits 26 with proportioned degree as long as the side surface 116 is arc-like. So, the protrusions 18 can also be cylindrically configured.

While the present invention has been described with reference to specific embodiment, the description is illustrative of the invention and is not to be construed as limiting the invention. Various modifications to the present invention can be made to the preferred embodiment by those skilled in the art without departing from the true spirit and scope of the invention as defined by the appended claims.

What is claimed is:

1. A socket connector for electrically connecting an integrated circuit package to a printed circuit board comprising:
   an insulative housing holding a plurality of conductive terminals thereon and defining a bottom wall round the terminals;
   a stiffener body surrounding the housing;
   a load plate pivotably assembled with one end of the stiffener;
   a load lever pivotably assembled with the other end of the stiffener;
   wherein
   the housing defines a plurality of semi-cylindrical protrusions extending from the bottom wall toward the PCB, each of the protrusions defining a bottom surface substantially parallel to the PCB and a side surface substantially perpendicular to the bottom surface, and the stiffener defines a plurality of semi-circled slits corresponding to the protrusions, and the housing is assembled with the stiffener body by virtue of cooperation of the protrusions and the slits so that a distance from the bottom surface to the PCB is shorter than a distance from the bottom wall to the PCB.

2. A socket connector for connecting an integrated circuit package to a printed circuit board, comprising:
   an insulative housing defining a plurality of arrayed passageways, the housing having a bottom wall defining a plurality of protrusion extending toward the PCB therefrom;
   a plurality of terminals received in the passageways;
   a stiffener body surrounding the housing, the stiffener body defining a plurality of slits corresponding to the protrusions;
   a load lever assembled to one end of the stiffener body and the load lever also assembled to the other end of the stiffener body; wherein
   each of the protrusion is provided with an arc-like side surface for cooperating with the slit; wherein
   the protrusion is semi-cylindrically configured; wherein
   the slit is semi-circled.

3. The socket connector as described in claim 2, wherein the protrusion comprises a bottom surface substantially perpendicular to the side surface.

4. The socket assembly as described in claim 2, wherein the protrusion defines a bottom surface substantially to the PCB so that a distance from the bottom surface to the PCB is shorter than a distance from the bottom wall to the PCB.

5. The socket connector as described in claim 2, wherein the protrusion is cylindrically configured.

6. A socket connector for connecting an integrated circuit package to a printed circuit board, comprising:
   an insulative housing having a plurality of terminals therein;
   the housing including four side walls and a bottom wall joined with lower portions of said four side walls, the four side wall defining a first dimension from a top view and the bottom wall defining a second dimension, from said top view, smaller than said first dimension;
   a metallic stiffener defining a plate wall with an opening therein, said opening defining a third dimension, from the top view, similar to said second dimension;
   a load lever assembled to one end of the stiffener body and the load lever also assembled to the other end of the stiffener body;
   the four side walls of the housing seated upon the plate wall of the stiffener with the bottom wall of the housing being snugly received in the opening; wherein
   the plate wall of the stiffener defines an arc-like recess communicatively beside said opening, and the bottom wall defines on a lateral surface thereof a corresponding arc-like protrusion squeezed in said arc-like recess so as to reliably retain the housing to the metallic stiffener; wherein the protrusion is semi-cylindrically configured; wherein the recess is semi-circled.

7. The socket connector as claimed in claim 6, wherein said protrusion does not laterally extend beyond the corresponding side wall and thus is still within the first dimension.

* * * * *